(12) United States Patent
Cowham

(10) Patent No.: US 6,211,525 B1
(45) Date of Patent: Apr. 3, 2001

(54) DETECTOR DEVICES

(75) Inventor: Michael John Cowham, Cambridge (GB)

(73) Assignee: KE Developments Limited, Cambridge (GB)

( * ) Notice: Subject to any disclaimer, the term of this patent is extended or adjusted under 35 U.S.C. 154(b) by 0 days.

(21) Appl. No.: 09/214,007

(22) PCT Filed: Jun. 30, 1997

(86) PCT No.: PCT/GB97/01731
  § 371 Date: Dec. 23, 1998
  § 102(e) Date: Dec. 23, 1998

(87) PCT Pub. No.: WO98/00853
  PCT Pub. Date: Jan. 8, 1998

(30) Foreign Application Priority Data

Jul. 1, 1996 (GB) .................................................. 9613728

(51) Int. Cl.⁷ .............................. H01J 37/28; G01T 1/20; G01N 23/203
(52) U.S. Cl. ..................................... 250/484.2; 250/483.1; 250/310; 250/397; 250/399
(58) Field of Search .............................. 250/483.1, 484.2, 250/306, 310, 311, 397, 398, 399, 484.3, 484.4, 368

(56) References Cited

U.S. PATENT DOCUMENTS

| | | | |
|---|---|---|---|
| 3,783,281 | * | 1/1974 | Crewe ................................. 250/311 |
| 4,217,495 | * | 8/1980 | Robinson ............................. 250/310 |
| 4,700,075 | * | 10/1987 | Kurz et al. ............................ 250/368 |
| 5,393,976 | * | 2/1995 | Koike .................................. 250/310 |
| 6,031,230 | * | 2/2000 | Toumatsu ............................ 250/310 |

* cited by examiner

*Primary Examiner*—Constantine Hannaher
*Assistant Examiner*—Albert Gagliardi
(74) *Attorney, Agent, or Firm*—Synnestvedt & Lechner LLP

(57) ABSTRACT

In a Scanning Electron Microscope (SEM) a spot made from a very narrow beam of electrons (11) is scanned in fine strips across the specimen (18), and an image is built up from the electrons (e) that backscattered from area of specimen being scanned. To gather these back-scattered electrons it is presently common to employ a scintillator layer on the front face of a light guide that directs the generated light to a photomultiplier tube (23). However, having the scintillator layer on the front face means that the light has to pass through the layer to enter the guide, which necessarily wastes light by absorption within the thickness of layer material; the invention proposes instead that the light guide (22) have on its back side a scintillator layer (34) angled as though to reflect received electrons along the guide to the PMT (23). In this way the PMT is actually "looking at", and so receiving light directly from, the front, or input side, of the scintillator layer, and thus the light emitted by the layer does not need to travel through the layer to get to the PMT, and is therefore not attenuated by that layer—and a detector system of the invention is therefore several, even tens, of times more sensitive that one of the Art.

10 Claims, 2 Drawing Sheets

DETECTOR DEVICES

Figure 1:
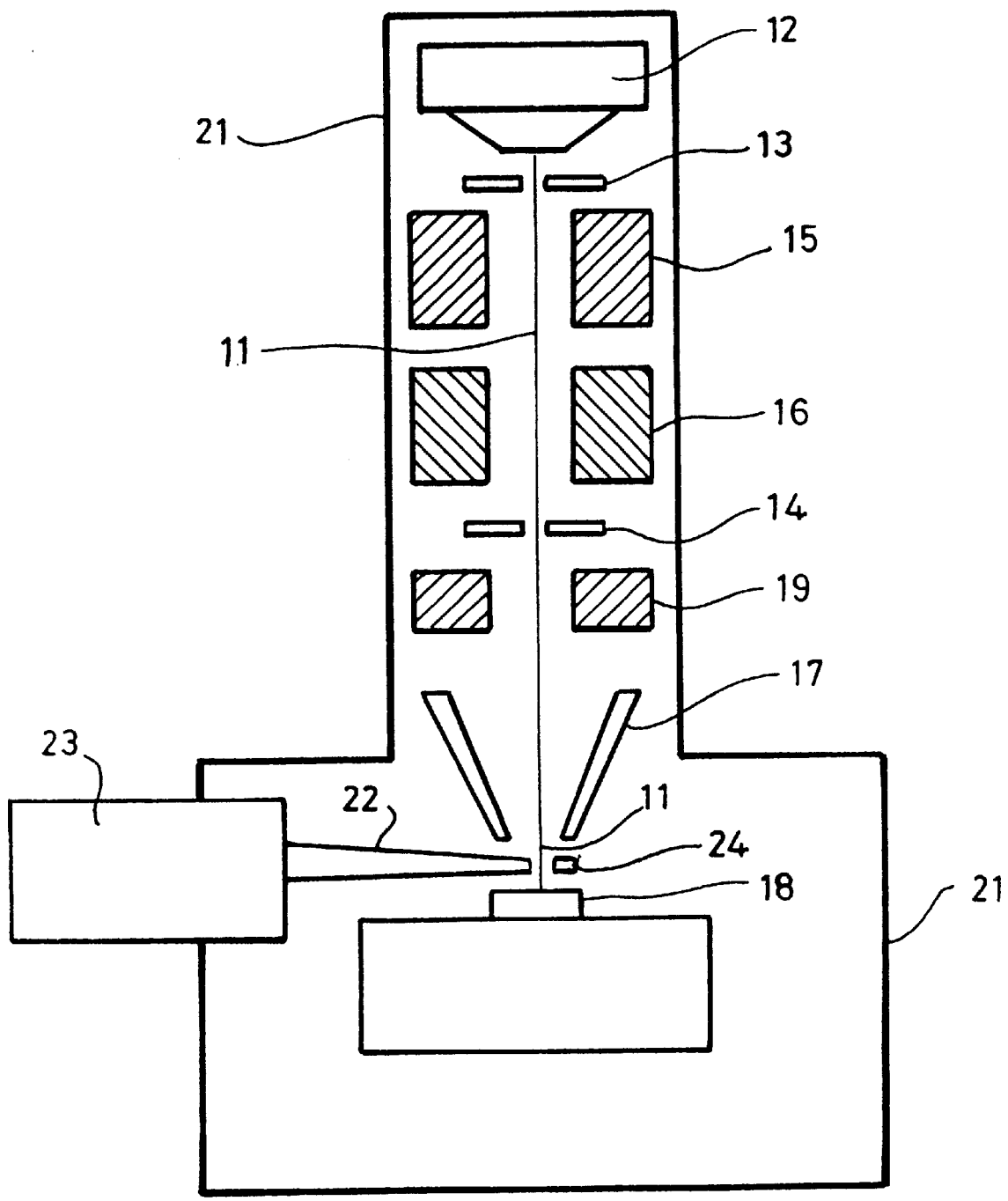

This invention relates to detector devices, and concerns more particularly devices for detecting electrons emanating from the specimen being examined by a scanning electron microscope or the like.

In a conventional light microscope the specimen to be examined is illuminated with visible light—that is, photons with wavelengths in the range to which the human eye is sensitive—and then viewed either by gathering and using the reflected light, to provide information about its surface and shape, in the way that any ordinary object is viewed by the eye, or by gathering and using the light that has been transmitted through it, to disclose details of its internal construction. Magnifying lenses and mirrors can be employed to increase the size of the image, and so make the specimen seem larger, and thus reveal features that the unaided eye cannot see, but inevitably there comes a point—at about 2000 times magnification—where further magnification is impossible because the items to be seen are much the same size as, or even smaller than, the wavelength of the light being used (and so in effect the light travels round them rather than impinging upon them, and without any interaction is unable to reveal anything about them). The "average" wavelength of visible light is around 600 nanometer (0.6 micrometer); by way of illustration, a light microscope can be employed to examine a bacterium or bacillus, because these are relatively large (about 10 micrometer and more in length), but it cannot be utilised to provide clear pictures of viruses, which, at a mere 1 micrometer or less across, are too small to be seen in any fine detail using light.

The electron microscope partially solves this problem by using electrons instead of light to illuminate the specimen. Electrons can behave as a waveform, much like the photons of light, but with a very much shorter wavelength (commonly around 0.001 micrometer and below); they can, therefore, be used to "look at" objects, such as viruses, and details of objects, that are much too small to be seen clearly with a conventional light microscope.

There are two main types of electron microscope. In the first, and older, known as a Transmission Electron Microscope (TEM), the whole of a very thin specimen is illuminated with electrons just as in a light microscope it is illuminated with light—this is rather like turning on a light bulb in a room—and those electrons that pass through it are allowed to fall on a screen which converts them into a visible image. In the second, and newer, type, known as a Scanning Electron Microscope (SEM), which is the sort with which the present invention is primarily concerned, a spot made from a very narrow beam of electrons is scanned in fine strips across the specimen, rather like waving a torch around in a room, and an image is built up from the electrons that emanate from the scanning spot (in the same sort of way that a complete television picture is made up from the light emitted from the TV screen's phosphors as they are scanned in strips with a spot-forming electron beam).

The beam of electrons impinging upon the target—the specimen—in an SEM can give rise to several different varieties of emanating electron. Most obviously there are those electrons that are transmitted through the specimen and are "viewed" from the reverse side; in this mode the microscope is acting as a Scanning Transmission Electron Microscope, or STEM. Next, there are the electrons from the beam that get reflected, or "back-scattered", off the specimen's surface; the invention is mainly concerned with these. Finally, there are the electrons that originate in the atoms from which the specimen is made, and which have been knocked free from those atoms by collisions with the scanning beam electrons; the freeing of these electrons is known as "secondary electron emission".

The electron beam can also cause other useful, and usable, energy forms to be emitted by the specimen. For example, some specimens will be of a material that, when struck by electrons, gives out electromagnetic radiation; depending on the material this radiation might take the form of X-rays or it might manifest itself as visible light photons. The emission of such photons is known as Cathodoluminescence Emission (CE).

In order to benefit from the effects of the electron beam the SEM must have some way of gathering the emanating electrons and converting them into a visible image. Moreover, because the intensity of the gathered electrons is inevitably rather low—in simple terms the specimen does not seem very bright—it is common directly or indirectly to amplify either the electrons themselves or the image they form until it is convenient for the human eye to see. One conventional method of achieving this is to cause the electrons to strike a scintillator—a device (or material) that gives off flashes of light when hit by electrons—and then to direct the thus-formed light to a photomultiplier which converts the flashes into significantly large pulses of electricity ("back", as it were, into electrons, but now in such large quantities that they can be used to drive or control ordinary equipment such as television or cathode ray screens). It is this, the primary detection of the gathered electrons (and specifically the back-scattered electrons) by their conversion into light using a scintillator, and the feeding of the thus-formed light to a photomultiplier tube or the like, with which the invention is primarily concerned.

At the moment one of the more successful detector systems available utilises a solid finger-like light guide (usually of a transparent acrylic plastic, though glass or quartz can also be employed) on the end side surface of which is a layer of scintillator material (typically a phosphor). The finger is mounted by its other end adjacent and projecting from the input screen of a photomultiplier tube (PMT), or the like, orientated with the scintillator layer facing the specimen, and poked into the path of the back-scattered electrons such that they impinge upon the layer to cause it to emit light. This light then passes through the layer into the body of the finger, which guides it (by total internal reflection) along to the far end where it shines out into the PMT.

This type of detector system, which has been in use for several years, is quite good, but nevertheless suffers from a number of disadvantages, of which perhaps the most serious arises from the conflicting requirements for the scintillator layer. The problem is that the layer needs to be thick, and relatively opaque to electrons, so as to have the best chance of capturing, and thus making light pulses from, most of the electrons that hit it (rather than letting them wastefully pass through without generating light), and yet at the same time it is most preferably thin enough to let those very pulses of light pass though it into the body of the light guide finger rather than being absorbed in and attenuated by the layer and so squandered.

It is this problem that the present invention seeks to solve—and to do so it proposes a solution so simple as at first sight to seem obvious and yet which has thus far been completely overlooked. More specifically, in accordance with the invention there is suggested an improved version of the light-directing finger having, instead of the side surface layer of scintillator material at the end to be inserted into the stream of back-scattered electrons, an electron receptor disposed so as to have a face angled as though to reflect received electrons along the finger to the PMT and having the scintillator material coating on that face. It will be appreciated that in this way the PMT is actually "looking at", and so receiving light directly from, the front, or input side, of the scintillator layer, rather than, as in the Prior Art detector described above, effectively looking at the back, or output side of the layer. Thus, the light that is emitted by the layer does not need to travel through the layer to get to the PMT, and is therefore not attenuated by that layer—and a detector system of the invention is therefore several, even tens, of times more sensitive that one of the Prior Art.

In one aspect, therefore, this invention provides an electron-gathering light guide for attachment to a light magnifier, the guide comprising an elongate light-guiding body mountable at one end at the magnifier, there being at the other end—the end to be inserted in use into the stream of electrons emanating from the specimen an area-extensive electron receptor disposed so as to have a face angled as though to reflect received electrons along the body to the mounting end, and having on that face a scintillator layer at which, in operation, received electrons are converted to photons which are then radiated away from the input surface of the layer towards the light magnifier.

It will be appreciated that when employing the electron-gathering guide of the invention, with its electron receptor disposed with the scintillator-coated face angled towards the light magnifier, the magnifier is actually "looking at", and so receiving light directly from, the front, or input side, of the scintillator layer.

The electron-gathering light guide of the invention is for use with an electron microscope, particularly a scanning electron microscope (SEM). It is not necessary at this juncture to discuss the details of SEMs, though it is perhaps convenient to note that the basic components of such a device are shown in one of the Figures of the accompanying Drawings. It is also worth observing that the narrow beam of electrons the SEM produces is generated by an electron gun at a high negative potential, frequently around 20,000 Volts (20 kV), but that the operation of most SEMs is in fact possible between 1 kV and 30 kV (and indeed some SEMs operate over an even wider range of voltages). Operation at the lower kVs is of particular significance; thus, the lower the voltage the less the damage to the specimen from the impacting electrons, while at around 1.5 kV the emanating electrons roughly balance the impacting electrons, so reducing the problems caused by charge build-up. In the present invention the emanated electrons are for the most part received directly on (and the light emitted directly from) the scintillator layer surface; there is no intermediate boundary layer to be penetrated, so not only does the system work well at higher kVs but even the lower energy (lower voltage) electrons provide a useful light output.

The electron-gathering light guide of the invention is for attachment to a light magnifier. The means of attachment can be any that is appropriate to the particular magnifier utilised—it might be a screw-threaded coupling ring or a bayonet fitting—while the magnifier itself may be any suitable light magnifying device, such as a photomultiplier tube (PMT). A typical photomultiplier tube is that bialkali type R268 tube sold by Hamamatsu, of Japan.

The invention's electron-gathering light guide comprises an elongate light-guiding body mountable at one end at the light magnifier and having at the other end an electron receptor. This body may take a number of forms, including that of a solid transparent "pipe" much like that used in the Art, but the preferred one is that of an internally-reflective (hollow) tube. Such a tube can be of any appropriate cross-section, and may be constructed in any suitable way. A preferred tube, however, is of rectangular section and of a wedge shape (tapering down towards the receptor end, so as to fit within the confined space above the specimen), and is fabricated from four separate elongate planar metal plates each made reflective on its "inner" surface. The plates, which should be of a non-magnetic but conductive material, typically aluminium, can be highly polished to provide the reflective surfaces, or they can be given a reflective coating (which may be appropriate to the nature of the light emitted by the scintillator; thus, gold coatings are preferred for infrared).

The preferred form for the elongate light-guiding body is that of an internally-reflective tube mountable at one end at the light magnifier and having at the other end an electron receptor. This tube is most preferably wedge-shaped, tapering down from the magnifier end, where it is sized to fit over the input face of the magnifier, towards the tip, or receptor end, where it is sized—and more specifically made wide but thin—to fit within the confined space between the specimen and the output of the SEM. As with other detectors, the tip should be as thin as possible so as to fit within the available space while it should also be as thick as possible for the most efficient gathering and transmission of the small light signals emitted by the scintillator. These conflicting requirements necessitate some compromise, and in the case of the present invention's system, with its considerably improved sensitivity, some of this efficiency can be, and conveniently is, sacrificed to keep the tip thin. In a preferred embodiment of the invention the tip has a thickness of around 4 mm.

The body of the electron-gathering light guide is mountable at one end at the light magnifier and has at the other end an electron receptor. The receptor is an area-extensive device—that is, it extends to cover, and thus gather emanated electrons over, a significant area (defining a suitably large solid angle subtended from the specimen)—and is so disposed that what might be termed its "working" face—that face of it that receives electrons emanating from the specimen—is angled as though to reflect the received electrons along the guide body to the mounting end. On that face is a scintillator layer.

At its simplest the receptor is merely a rigid supporting substrate—a plate, or plate-like member—with the scintillator layer on its working face, and is mounted at the end of the body (in any suitable way, but preferably detachably so that it may more easily be changed or replaced) with the face angled to look both at the specimen and (along the body) at the magnifier. In a slightly more complex design the receptor substrate is a thin wedge, the wedge surface carrying the scintillator layer and angled to face both the specimen and the magnifier. In each case the face's angle is merely any angle which will allow the face to receive directly electrons from the specimen and also will permit the light that the scintillator layer's surface emits to shine directly into the guide without first passing through any of the thickness of the layer. Angles of from around 20° to 40°, more especially from around 20° to 30°, to the specimen support plane seem quite satisfactory, and though the larger angles give the better results a compromise must be reached between the size of the angle and the concomitant thickness of the receptor. At present the preferred angle is 22°.

However, whether simple plate or more complex wedge, it must be possible for the stream of electrons from the SEM's electron gun to pass to, and scan over, the specimen while the electron-gathering guide of the invention is in place, and with the receptor directly in line between the gun and the specimen this will normally mean that the receptor has an aperture generally centrally of it and through which the electron beam can pass to illuminate the specimen. This aperture is desirably sufficiently large to permit the scanned electron beam to pass through unhindered even at the lowest magnifications (when it is scanning the largest area of the specimen). An aperture size of around 3 mm diameter is satisfactory for the majority of SEMs.

Most conveniently the aperture is lined with a conductive tube that extends slightly beyond the surface of the receptor's scintillator layer; this has the effect that the electron beam stigmation—the beam's essentially round cross-section—is not distorted by small areas of local charging of that layer adjacent the aperture. The tube, which can be of almost any conductive internally-reflective material, though polished aluminium is preferred, also shields the preferred slightly asymmetrical form of the receptor from the electron beam, thereby reducing the possibility of astigmatic distortion due to asymmetrical proximity effects.

The size and shape of the scintillator-coated receptor substrate can be whatever is appropriate for gathering the emanating electrons; there are, though, certain problems that should be designed for. More specifically, and as can be seen from simple geometry, the angled disposition of the receptor working face coupled with the large size of the receptor relative to the specimen and the spacing between them means that, of the emitted light derived from back-scattered electrons impinging upon the scintillator layer, the quantity entering the light guide from that area of the layer nearest the guide will be significantly larger than that from the area furthest from the guide. Moreover, other factors, such as the light-blocking nature of the receptor's electron-beam aperture and its projecting tube lining, have much the same sort of unbalancing effect. In other words, the system has the disadvantage that it will transmit more light, and so seems to be more sensitive, from the side of the receptor that faces the magnifier. This effect is very difficult to overcome completely, but by producing a receptor with an asymmetric face (with the beam aperture located further to the magnifier side), and having a concave working face—either smoothly curved or in two or more flat portions—the light from the far side of the scintillator may be made to have more prominence than light from the near side. By carefully adjusting the effective proportions of the surface to each side of the electron beam a position may be found where reasonably equal collection and transmission is possible from both.

The material of the receptor substrate is very preferably a good electrical conductor, by which the charge collected on the supported scintillator layer from the gathered electrons may more easily be drained away to earth (ground). Typically, the substrate is, like the guide body, of a metal, for example aluminium.

The electron receptor has a scintillator layer on its working face. This scintillator layer may take any suitable form, and may be of any appropriate material. As to form, it is conveniently no more than a thin layer on the receptor substrate, typically from 10 to 100 micrometer thick (the thicker the layer the better the chance that all the electrons are captured, but the greater the likelihood of an light photon emitted deep therein of failing to get back out). As to material, it may, for example, be a phosphor, typically the common P47 phosphor which is highly sensitive and emits light in the region of 440 nm (which closely corresponds to the standard bialkali PMT that is used), but there are a number of other phosphors some of which have better low kV characteristics and some of which have a higher sensitivity at high kVs. Alternatively, rather than use a phosphor the scintillator may employ another type of light-emitting material. Thus, single-crystal scintillators of Yttrium Aluminium Garnet (YAG) or Yttrium Aluminium Perovskite (YAP) further extend the capabilities of the invention; these materials are particularly sensitive scintillators. Both YAG and YAP are also available in powder form, which may be used directly to coat the angled receptor face, and are much less expensive.

The detector system of the invention is a considerable improvement on those detectors presently in use. Its sensitivity is much higher than competitive units, and its low kV performance is considerably better than most of its rivals. And due to its high sensitivity and the relatively thin tip, this new detector is ideal for utilisation with field emission SEMs (which are particularly used for the highest magnification applications, and run at very low probe currents; backscattered detection under these conditions has always been difficult, but the new device described will, due to its high sensitivity, help in this critical application). Moreover, the thin profile of the invention's device also makes it very suitable for use with high pressure SEMs in which, due to the molecules of gas that still remain, backscattered electrons and even the primary electron beam can only travel for a short distance before becoming attenuated or dispersed, so that the specimen must be placed quite close to the electron lens, reducing travelled path length and making the requirement for a thin detector imperative.

Finally, the detector system of the invention may also be used to considerable advantage in STEM systems in both the SEM and TEM. In this case, the scintillator tip is placed beyond the specimen, to receive the electrons that have passed straight through the thin specimen. Bright field images will be seen with the detector directly beneath the specimen, and dark field images when the detector is placed to one side. Due to its exceptionally high sensitivity, the detector may be placed a considerable distance to the side of a STEM specimen thereby picking up only those electrons that have been very widely scattered. This information provides further intelligence about the specimen, its composition and its thickness.

Figure 2A:
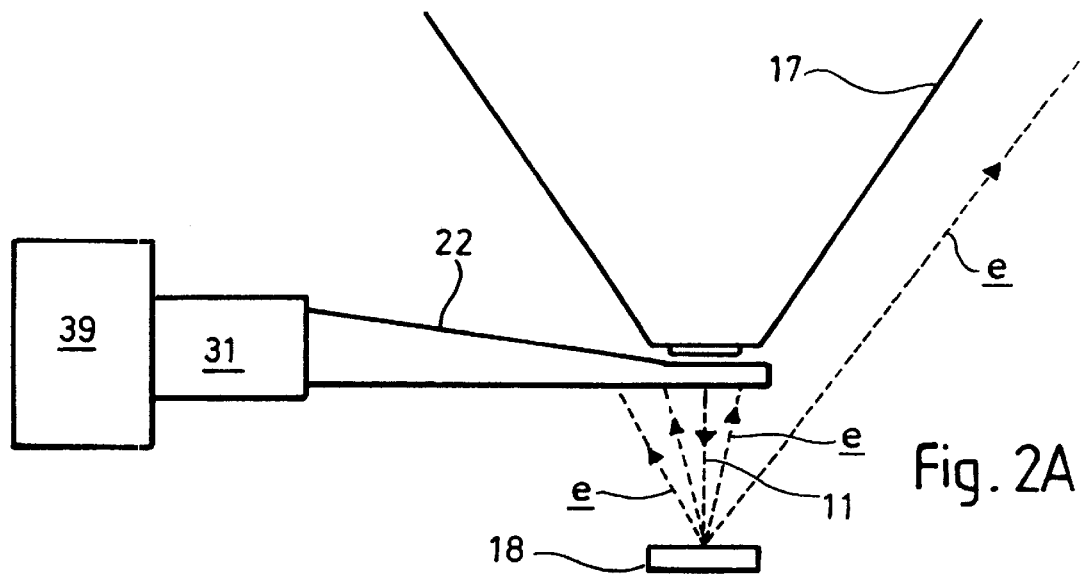
Figure 2B:
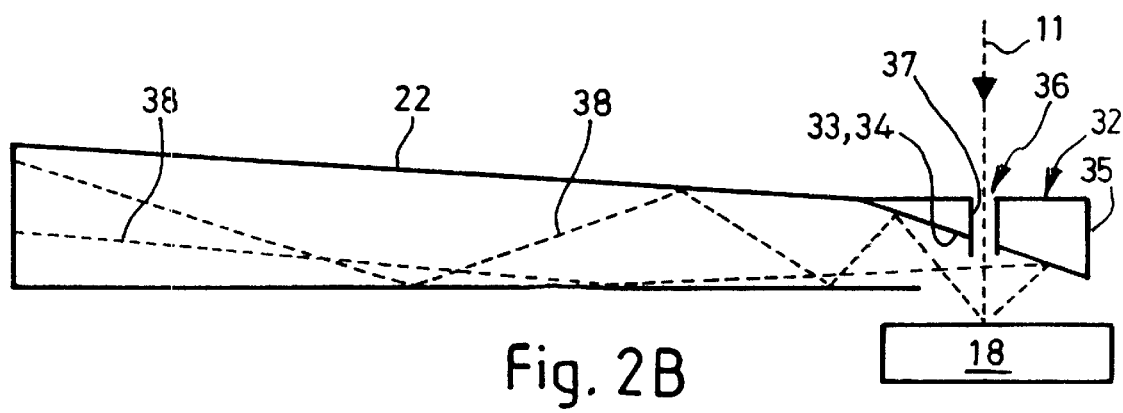
Figure 3A:
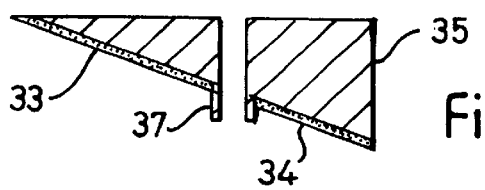
Figure 3B:
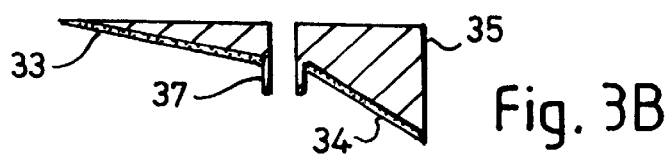
Figure 3C:
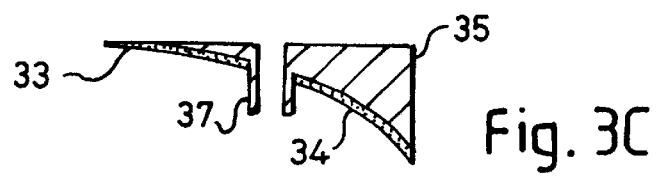

Embodiments of the invention are now described, though by way of illustration only, with reference to the accompanying schematic Drawings in which:

FIG. 1 shows the main components of a typical scanning electron microscope;

FIGS. 2A, B show an electron-gathering light guide of the invention in use with a scanning electron microscope;

FIGS. 3A–C show different forms of electron receptor usable with an electron-gathering light guide of the type shown in FIGS. 2.

The scanning electron microscope shown schematically in FIG. 1 is an instrument that is used to give highly magnified images from a solid specimen. It operates by producing a fine stream or beam of electrons (11) that come from an electron gun (12). The beam is guided through various limiting, shaping and directing aperture plates (13, 14) and electrostatic and magnetic lenses (from condenser coils 15,16 and objective focusing electrode 17) so that it forms a very small spot on the solid specimen (18). The electron beam is scanned from side to side and from top to bottom, in a manner not unlike that of a television screen, using scanning coils (19); the scanned area of the specimen is extremely small. The whole is contained within a vacuum chamber (21).

As the electron beam strikes the specimen, some of the electrons are reflected back ("back-scattered": see FIGS. 2).

These electrons contain valuable information about the surface of the specimen from which they have bounced. They may be collected by a suitable detector system, which turns the received signal into a modulated voltage. In the detector system of the invention there is an electron-gathering light guide (22) mounted on a light magnifier (in this case a photomultiplier tube 23) and gathering the back-scattered electrons by an electron receptor (24) at its tip (the details of this are shown in FIGS. 2 and 3).

By means not shown here, the detector system's photomultiplier's output voltage is amplified and applied to the modulation electrode of a cathode ray tube (CRT), and provides a television-like picture of the scanned area of the sample. Magnification is controlled by the ratio between the scanned area on the specimen and that on the CRT. The size of the CRT is basically fixed, therefore to increase the magnification the area of the specimen being scanned must be reduced. Conversely, to reduce magnification, it is necessary to increase the area being scanned.

In order that high magnifications may be produced, (and for the SEM the range of magnification can be expected to be between ×10 and ×100,000 or sometimes higher), the electron beam diameter that is scanned across the specimen must be kept as small as possible—at worst it should be no more than $\frac{1}{100}$ and preferably no more than $\frac{1}{1000}$ part of the width of the picture formed. This fine focusing is done by passing the beam through the several condensing and focusing stages 15,16,17. The beam also needs to be kept round and not elliptical or otherwise distorted. This is controlled by astigmatism controls (not shown) which artificially stretch the shape to keep its cross section round.

The SEM normally operates with the electron gun at a high negative potential. As noted hereinbefore, this voltage is frequently around 20,000 Volts (20 kV), but operation of most SEMs is possible between 1 kV and 30 kV. Some SEMs operate over a wider range of voltages; operation at the lower kVs is of particular significance in the current invention although the device also performs well at all the usual kVs. The current in the electron beam is very small, and is generally in the range from 1 picoAmpere to 10 nanoAmpere, ($10^{-12}$ to $10^{-8}$ Ampere).

SEMs produce the electron beam from various types of electron gun. These include guns producing electrons by thermionic emission from a heated cathode, and guns producing the electrons by field emission where the electrons are extracted from a very fine point with the aid of high extraction voltages. Some SEMs use a combination of both methods. The field emission SEM generally produces less current in the electron beam but the resultant electron beam (or probe size) can be considerably smaller than with thermionic emission.

As the electron beam 11 strikes the surface of a specimen 18 several things may happen. Thus, secondary electrons—electrons that are dislodged from the atomic structure of the specimen by the high energy of the electron beam—are produced by the collision of the beam with the specimen. Secondary electrons generally give information only about the extreme surface of the specimen. Another effect is that of backscattered electron emission, where some of those electrons which originally hit the specimen at high velocity are reflected or bounced off the surface.

Backscattering

Backscattering is dependent on the elemental composition of the specimen. Generally, for an increase in atomic weight of the specimen the backscattering coefficient will increase. This means that for a specimen containing several phases of different materials the backscattered electrons, if efficiently collected, will show the difference between low and high atomic number areas. This effect is generally monotonic, with the backscattering coefficient increasing almost linearly with atomic number. The high energy electron beam penetrates some small distance into the specimen. The deeper it penetrates, the less chance there is of the electrons being backscattered out again. Those that do penetrate more deeply will loose some of their energy due to multiple collisions, and by the time that they emerge they may not emerge at 180° to the incoming electron beam but will be more widely scattered, emerging at various angles.

Backscattered electrons generally travel in a straight line due to their high energies, which makes them quite easy to detect. It is difficult, though, to detect all of them due to the fact that they are usually emitted through a solid angle of around 180°, and to attract such high energy particles into a detector by an electrostatic field would necessitate a voltage of many 1000s of volts, which would cause severe distortions to the primary electron beam, making high resolution operation impossible. Backscattered electrons must therefore be collected at their own energy. The ideal detector is notionally a hemispherical one, fitted above the specimen to wrap around so as to cover a full solid angle of 180°, but this is not really practical. Not only must a hole be left at the top to allow the electron beam to enter and reach the specimen, which hole must be large enough not to restrict the scanned beam in any way, but at the sides of the specimen there must be a clear gap so that the movement of the specimen under the beam is not hindered. The collection, therefore, has to be made by an area of receptor face smaller than that desired.

The current in the primary electron beam is commonly between 1 pA and 10 nA; the current in the total backscattered electron emission may be considerably less than that. If a very sensitive amplifier were to be fitted, a signal could be produced at the higher probe currents used, but nothing would be seen from the lower currents. An improved method of detection is therefore necessary.

Several dedicated detectors have been produced for the collection of these important backscattered electrons. One, noted hereinbefore, consists of a (retractable) acrylic lightguide finger that sits above the specimen and just below the final lens (at the point where the electrons emerge from the electron optics and scanning system). The detector has in it a small hole, or sometimes a slot, for the electron beam to pass through; on its surface, closest to the specimen, is a layer of a scintillating material, typically a phosphor. As the backscattered electrons strike the scintillator they are converted to light, which passes through the scintillator layer into and down the finger and on to a PMT or similar light detector. This system gives a reasonably efficient means of sensing these backscattered electrons. It does however have several drawbacks. The most important of these is that, for reasons to do with geometry, absorption and attenuation following multiple reflections, and other factors, the finger, whatever its shape, will show a higher sensitivity in the direction of the PMT. This means that the signal received favours one side of the specimen, and this asymmetry produces a signal that contains some usually unwanted topographic information. This can be a problem when looking for small atomic number differences in the specimen's composition.

This type of detector also has another major problem; because it is made of acrylic, it is non-conductive electrically, and the absorbed electrons would ordinarily cause it to become charged until it repelled further electrons. To overcome this the acrylic must be made conductive, usually by the application of a metallic (or similar) coating.

But this, too, has its disadvantages; if applied between the scintillator material and the light guide this coating will also restrict the penetration of light into the light guide, while if applied on top of the scintillator material then it acts as a barrier to the lower energy electrons arriving at its surface.

For efficient transmission of the light to the PMT, this type of finger should be as thick as possible, but this is difficult because in the region between the lens and the specimen space is very limited (typical lens-to-specimen working distances are 12 mm, and for high resolution work this needs to be less). Consequently the detector is made with a thickness of around 6 mm, being a compromise between thickness and efficiency.

A third effect of bombarding a specimen with electrons is Cathodoluminescence Emission (certain specimens when excited by an electron beam will produce small quantities of light). The small signals obtained are collected in a similar way to backscattered signals, but without the necessity for a scintillator.

A fourth effect is electron absorption. As the electron beam strikes the solid sample some of the electrons penetrate and fail to emerge again at the surface. These are absorbed and pass quickly to ground through the specimen. An image is possible from this signal by passing this small absorbed current through a very sensitive amplifier.

Yet another effect is, of course, electron transmission (as in a TEM). With a very thin specimen much of the electron beam will pass right through the specimen. If a suitable detector is placed beyond the thin specimen, this will receive signals that vary mostly due to the thickness and the composition of the specimen.

The present invention relates to an improved and more efficient form of backscattered electron detector. It is shown schematically in FIGS. 2.

The detector system of the invention is an electron-gathering light guide for attachment to a light magnifier (31). The guide comprises an elongate light-guiding body (22) mountable at one end at the magnifier (31) and carrying (by means not shown) at the other end—the end to be inserted in use into the cone of backscattered electrons (as e) emanating from the specimen—an area-extensive electron receptor (generally 32 in FIG. 2B) disposed so as to have its working face (33) angled as though to reflect received electrons e along the body to the mounting end, and having on that face a scintillator layer (34).

The receptor substrate is a thin wedge (35) of polished aluminium, and in the embodiment shown the scintillator layer 34 material is a phosphor deposited directly on it. This thin wedge has a hole (36) though its centre through which the electron beam 11 passes. The hole is lined with a polished bore aluminium tube (37) that extends slightly below the lower face 33 where the wedge is coated with the phosphor 34 so that the electron beam stigmation is not distorted by small areas of local charging of the phosphor. The tube 37 also shields the slightly asymmetrical form of the wedge 35 from the electron beam 11, thereby reducing the possibility of astigmatic distortion due to asymmetrical proximity effects.

The wedge 35 is angled such that the PMT has a direct view of its working face 33,34, although at an angle, and is mounted at the end of—effectively "inside"—the light pipe 22, which is here constructed from four aluminium plates (not shown separately). The guide tapers down to the receptor end, allowing the scintillator's emitted light (as 38) to be transmitted either directly to the PMT or by one or more internal reflections. The PMT output is then used to control the image of a video system (39).

As with other detectors, the very tip should be as thick as possible for the most efficient transmission of the small light signals; in this particular case, however, the greatly improved sensitivity of the system has permitted some of this efficiency to be sacrificed to keep the tip small (as shown it has a thickness of around 4 mm).

As discussed hereinbefore, the detector system of the invention as so far described still has the disadvantage that it is more sensitive from the side facing the PMT. This effect is very difficult to overcome, but by producing a receptor with a shaped working surface 33—a concave surface, either curved or in two or more flats—the light from the far side of the scintillator layer may be made to have more prominence than light from the side next to the PMT. FIG. 3 show receptors with a "flat" working face (FIG. 3A) and with shaped faces (FIGS. 3B,C). By carefully adjusting the proportions of the surface to each side of the electron beam a configuration can be found where equal collection is possible from all sides.

What is claimed is:

1. An electron-gathering light guide for attachment to a light magnifier, the guide comprising an elongate light-guiding body mountable at one end at the magnifier, there being at the other end—the end to be inserted in use into the stream of electrons emanating from the specimen an area-extensive electron receptor disposed so as to have a face angled as though to reflect received electrons along the body to the mounting end, and having on that face a scintillator layer at which, in operation, received electrons are converted to photons which are then radiated away from the input surface of the layer towards the light magnifier.

2. A guide as claimed in claim 1, wherein the elongate light-guiding body is in the form of an internally-reflective hollow tube.

3. A guide as claimed in claim 2, wherein the tube is of rectangular section and of a wedge shape, tapering down towards the receptor end.

4. A guide as claimed in claim 3, wherein the tube is fabricated from four separate elongate planar metal plates each made reflective on its inner surface.

5. A guide as claimed in claim 1, wherein the electron receptor is in the form of a thin wedge, the wedge surface carrying the scintillator layer and angled to face both the specimen and the magnifier.

6. A guide as claimed in claim 1, wherein the electron receptor has an aperture generally centrally of it and through which the electron beam can pass to illuminate the specimen, and this aperture is lined with a conductive tube that extends slightly beyond the surface of the receptor's scintillator layer.

7. Guide as claimed in claim 6 wherein the electron receptor has a concave working face.

8. A guide as claimed in claim 1, wherein the electron receptor has an asymmetric face, with the beam aperture located further to the magnifier side.

9. A guide as claimed in claim 1, wherein the electron receptor has a concave working face.

10. An electron microscope, whenever fitted with electron-gathering light guide as claim in claim 1.

\* \* \* \* \*